United States Patent [19]

Premerlani et al.

[11] Patent Number: 4,872,126

[45] Date of Patent: Oct. 3, 1989

[54] DIGITAL CIRCUIT DESIGN VERIFICATION

[75] Inventors: William J. Premerlani, Scotia; David R. Musser; Paliath Narendran, both of Schenectady, all of N.Y.

[73] Assignee: General Electric Company, Schenectady, N.Y.

[21] Appl. No.: 142,897

[22] Filed: Jan. 11, 1988

[51] Int. Cl.$^4$ ...................... G06F 15/20; G06F 11/00
[52] U.S. Cl. ..................................... 364/578; 371/23
[58] Field of Search ............... 364/578, 488, 489, 490; 371/23, 25, 27

[56] References Cited

U.S. PATENT DOCUMENTS 4,644,487  2/1987  Smith .................................. 364/578
4,696,006  9/1987  Kawai .................................. 371/25

FOREIGN PATENT DOCUMENTS 160944  11/1985  European Pat. Off. ............ 364/578

Primary Examiner—Felix D. Gruber
Attorney, Agent, or Firm—John S. Beulick; James C. Davis, Jr.; Paul R. Webb, II

[57] ABSTRACT

A system and method for modeling digital circuit elements to enable verification of circuit design by formal proofs using a computerized theorem proving system, is disclosed.

12 Claims, 1 Drawing Sheet

DIGITAL CIRCUIT DESIGN VERIFICATION

The present invention is directed in general towards methods for verifying the design of digital circuits and, more specifically, to a system and method for modeling the elements of a digital circuit to enable circuit verification using an automated theorem proving system.

BACKGROUND OF THE INVENTION

There are two categories of verification methods presently known for verifying digital circuit designs. In one category are simulation methods in which various combinations of inputs are applied to a computer model of the circuit and signals at various places in the circuit are observed. The problem with these verification methods is that for complex circuits there is simply not enough time to apply all possible combinations of inputs. Circuits that are verified using this method have been known to contain errors that are only subsequently discovered.

The other circuit design verification method category comprises formal proofs in which from a description of a circuit it is proved that the circuit behaves in the specified way. It is therefore necessary to prepare a behavioral specification of the circuit and then determine by proofs whether the circuit model satisfies the specified behavioral requirements.

There are several different techniques known in the circuit verification art for modeling digital circuit hardware for verification by formal proof. One such technique uses a register-transfer model in which hardware devices are divided into combinational and sequential device types. Both types of devices are described by functions, with the sequential device functions taking an extra argument representing an internal state when the circuit is clocked. Aspects of the register-transfer model are described in "A Very Simple Model of Sequential Behavior of nMOS", by Gordon, Proc. VLSI International Conference, J. Gray Editor, Academic Press, London and New York, 1981 and "FM8501: A Verified Microprocessor" by Hunt, Jr., Technical Report 47, University of Texas at Austin, December 1985.

A second modeling technique uses state transition models where each circuit device is modeled by a state machine. Connections between the devices are represented by equating some state variables of one device with those of another device. Aspects of the state transition model are described in "Proving the Correctness of Digital Hardware Designs" by Barrow, VLSI Design, July 1984.

In a third modeling technique, hardware devices are specified using predicates that constrain the values present on lines interconnecting the devices. Aspects of the predicate model are described in "Why Higher-Order Logic is a Good Formalism for Specifying and Verifying Hardware" by Gordon, Technical Report, University of Cambridge, Cambridge, U.K., 1985 and "A Temporal Logic for Multilevel Reasoning About Hardware" by Moszkowski, IEEE Computer, February 1985.

A primary disadvantage of the register-transfer and state transition models is their inability to represent as bidirectional an individual line into a circuit device. While the predicate model can represent such lines as bidirectional, it fails to capture all relevant aspects of bidirectionality. This shortcoming of the predicate model is illustrated with respect to a CMOS implementation of an inverter, such an inverter 100 being illustrated in FIG. 1. The letters "i" and "o" are shown to denote the input and the output lines, respectively, of the inverter. In accordance with the predicate model of the inverter, it can be shown to satisfy the specification:

Inverter(i,o){(o=¬i)} where ¬ is the "not" operator of predicate logic. Note, however, that since (o=¬i){(i=¬o), there follows:

Inverter(i,o){(i=¬o)} which implies that the device will function as an inverter in either of two ways, i.e. with either i or o designated as its input line. It is evident that the actual circuit will not operate as an inverter in both such ways, but only with the line i being the input line. Thus, in the illustrated example, the predicate model provides an erroneous representation of bidirectionality. It would therefore be desirable to provide a digital circuit modeling technique, for use in circuit verification by formal proof, that enables accurate modeling of line bidirectionality.

The above described prior art modeling techniques also fail to provide means for modeling charge sharing. It would therefore be desirable to provide a digital circuit modeling technique for use in circuit verification by formal proof, that enables modeling of charge sharing.

It is therefore a principal object of the present invention to provide a system and method for modeling digital circuitry, for use in circuit design verification by formal proof, that is not subject to the aforementioned problems and disadvantages.

SUMMARY OF THE INVENTION

In accordance with the present invention, there is provided a system and a method for modeling a digital electronic circuit, using a plurality of primitive circuit elements, for formal verification of the circuit design using an automated theorem proving system. The circuit design is verified using the theorem proving system by formal proofs determining that each modeled portion of the circuit satisfies behavioral requirements specified therefor. The method commences with the steps of modeling selected portions of the circuit using the primitive circuit elements and representing each primitive circuit element as having at least one port.

The method then continues with the steps of representing each port as having two wires respectively designated an input wire and an output wire and characterizing each input and output wire by parameters designated strength, value, capacitance and charge. The strength parameter takes an integer value of 0, 1 or 2 respectively representing an open circuit, a moderate resistance or a low resistance. The strength parameter also takes on the values don't care or immaterial. The don't care value is assigned only where the respective value parameters of two wires are being compared. The immaterial value is assigned where the wire is unimportant. The value parameter takes on boolean values of true, false or uncertain, where the uncertain value denotes that it is unknown whether the value parameter is true or false. The capacitance parameter takes on an integer value that ranks a total capacitance available for delivering charge on the wire. The charge parameter takes on integer values that represent a sum of charges of capacitors respectively connected to the wire. The input wire parameters describe the conditions the balance of the circuit imposed on the port if the connection between the port and circuit were broken. The output wire parameters describe the condition the port would impose on the balance of the circuit if the connection between the port and circuit were broken.

The method continues with the step of connecting the respective ports of the primitive circuit elements to form each selected circuit portion. The respective ports of a first and a second primitive circuit element are connected by equating the input and output wires of the port of the first circuit element respectively with the output and input wires of the second circuit element port. Next, each verified circuit portion is modeled in terms of its specified behavioral requirements. The method concludes with the step of modeling each unverified circuit portion that is identical to one of the verified circuit portions in terms of the specified behavioral requirements of the identical verified portion. As a result, each unique circuit portion need only be verified once.

In accordance with the present invention, a system for the formal verification of the design of a digital electronic circuit comprises means for modeling selected circuit portions using the primitive circuit elements and a computerized theorem proving system for verifying by formal proofs that each modeled portion of the circuit design satisfies the behavioral requirements specified therefor. The characteristics of primitive elements, ports and wire parameters in the circuit are as described above with respect to the method of the present invention. The system further includes means for connecting the respective ports of the primitive circuit elements by equating the input and output wires of one element port respectively with the output and input wires of another element port. The system also includes means for modeling each verified circuit portion in terms of its specified behavioral requirements and means for modeling each unverified circuit portion that is identical to one of the verified circuit portions, in terms of the specified behavioral requirements of the identical verified portion. Then, as indicated above, each unique circuit portion need only be verified once.

BRIEF DESCRIPTION OF THE DRAWINGS

While the specification concludes with claims defining the features of the invention that are regarded as novel, it is believed that the invention, together with further objects thereof will be better understood from a consideration of the following description in conjunction with the drawing figures in which:

DESCRIPTION OF THE INVENTION

Figure 2:
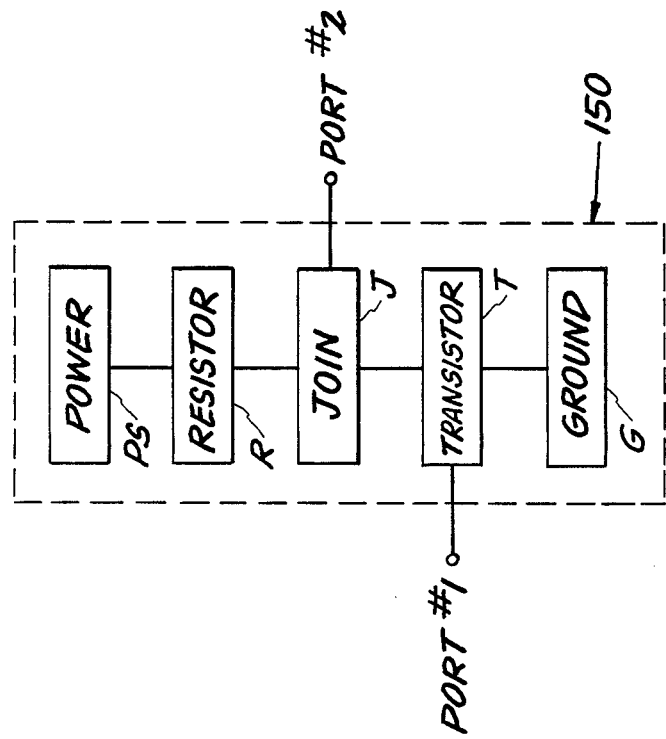
FIG. 2 illustrates an inverter constructed with the primitive elements of the present invention.
Figure 1:
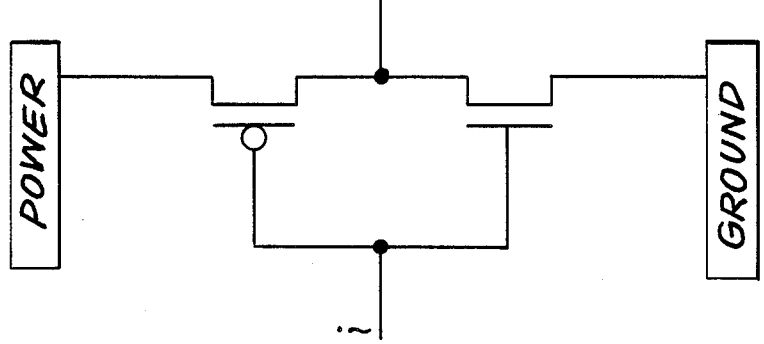
FIG. 1 illustrates a CMOS implementation of an inverter circuit which serves to illustrate a shortcoming of the prior art predicate modeling method.

The present invention is directed to a system and method for modeling digital circuit elements for circuit design verification by formal proof using an automated theorem proving system, i.e. a theorem proving system adapted for practice on a digital computer. In accordance with the present invention, a plurality of primitive digital circuit elements are defined and modeled for use in constructing portions of the digital circuits to be verified, i.e., a structural implementation of the circuit portion is specified in terms of the predefined primitive circuit elements. Each of these primitive elements is represented as an abstract data type. As is known in the circuit verification art, an abstract data type is one defined in terms of the operations that apply to objects of that type. Each abstract data type represents a set of states of the particular kind of primitive circuit element. The model of each digital circuit portion being verified is also represented as a state transition system.

A behavioral specification is next prepared for each modeled portion of the circuit being verified, the specification indicating how that circuit portion is supposed to perform, i.e., the desired properties of the circuit portion. The theorem proving system uses the behavioral specification to generate the verification conditions, or theorems, which must be proved for verification. It then proceeds to verify the design of the circuit portion by determining whether the circuit as modeled using the primitive elements (the structure specification) satisfies the verification conditions. Once a portion of the circuit design has been verified, it can be modeled in terms of its behavioral specification. Thus, where duplicate structures or cells occur in a digital circuit, it is only necessary to verify the design of one such cell and then use the behavioral specification therefor to model all duplicate cells. This approach to circuit design verification also enables the verification to have a recursive property in that the verification results for smaller circuit portions are subsequently used in the verification of larger circuit portions comprising these previously verified smaller portions. As will be recognized by those skilled in the circuit verification art, the circuit modelling most efficiently proceeds with the aid of either a schematics capture software package or integrated circuit layout tools practiced on a computerized workstation or computer.

In accordance with the present invention, a first primitive element, the "wire", is represented as an aggregate of four parameters: strength, value, capacitance and charge. The strength parameter takes on integer values that rank the reciprocal of the Thevenin equivalent resistance of a node. A strength of 2 indicates a low resistance associated with (physical) wires, conducting transistors and power supplies. A strength of 1 indicates a moderate resistance associated with pullup resistance. A strength of 0 indicates an open circuit such as is associated with a non-conducting transistor. The strength parameter can also take one the values "don't care" and "immaterial". The "don't care" value addresses the case where it is only required to compare the boolean values of two wires and not their respective strengths. The "immaterial" value addresses the situation where a wire is wholly unimportant to an analysis. An example of a case in which the "immaterial" value is used is in the multiplexer where there is no interest in the connections made thereby when the strength of the control input is 0. The "value" parameter takes on the boolean values true or false and is associated with the Thevenin equivalent voltage of a node. The value parameter can also take on the value "uncertain" when it is not known whether the logical condition is true or false.

The "capacitance" parameter takes on integer values that rank the total capacitance available for delivering charge on the wire. The "charge" parameter takes on integer values that correspond to the sum of charges of capacitors connected to a wire. It is noted that integer values rather than real values are used for the capacitance and charge parameters. This is adequate since for a trapped charge representation, it is only necessary to distinguish between zero and non-zero values. Also, integers enable representation of charge sharing. For convenience, the parameters of each wire are represented herein as a four-tuple (strength, value, capacitance, charge).

Each primitive element, except the "wire", has at least one port. A port consists of an input wire and an output wire. A port corresponds to an electrical terminal in a device. The pair of wires is used to model the interaction between the terminal and the balance of the circuit. The input wire describes the logical conditions that the balance of the circuit would impose if the connection between the circuit and port were broken. The output wire describes the conditions the port would impose if the connection were broken. Intuitively, the port is supposed to be "receiving" data on its input wire and "sending" data on its output wire. For a circuit element, or a circuit portion, with several ports, the output wire of one of the ports can be determined from the behavior of the circuit element or portion and the conditions at the input wires at all of the other ports. This two wire representation of each port is what enables the modeling of bidirectionality of each line.

In accordance with the present invention, two ports are connected by making the output wire of one go to the input wire of the other (i.e., by equating) and vice versa, the rationale being the handling of bidirectionality. Two wires are equal when their value and strength parameters are the same. The charge and capacitance of each wire can be ignored when strength is greater than zero. When the respective strengths of two wires are zero then they are equal if they have the same capacitance and charge. This is expressed in the following pseudolanguage representation which defines the equality of two wires w1 and w2:

```
define w1 = w2 ==
if (strength (w1) = imm) or (strength(w2) = imm)
then true
else
if (strength (w1) = dc) or (strength(w2) = dc)
then (value(w1) = value(w2))
else
if strength(w1) = 0
then (strength(w2) = 0) and
(capacitance(w1) = capacitance(w2)) and
(charge(w1) = charge(w2))
else
(strength(w1) = strength(w2)) and
(value(w1) = value(w2)),
```
where dc ≡ don't care
imm ≡ immaterial The remaining primitive elements are the resistor (R), power source (PS), ground (G), capacitor (C), transistor (T) and three-port join (J). The resistor element is a two port element. The resistor first port output wire is characterized by the four-tuple (1, value of resistir and second port input wire, capacitance of resistor and second port input wire, charge of resistor second port input wire) if the strength parameter of the resistor second port input wire is 2. If the resistor second port input wire strength is not 2, the resistor first port output wire is characterized by the same four-tuple as for the resistor second port input wire. This is expressed in the following pseudolanguage in which the first port of the resistor is composed of the wires in1 and out1, the second port of the resistor being composed of the wires into in2 and out2, and "s" is the state variable. Generally herein in the pseudolanguage, the four-tuple of strength, value, etc., is preceded by the term "wire" since the four-tuple serves to characterize those properties of the element "wire".

```
out1(s) =
if strength(in2(s)) = 2
then wire(1,value(in2(s)),capacit(in2(s)),charge(in2(s))))
else in2(s)
```

Similarly, a resistor second port output wire is characterized by the four-tuple (1, value of resistor first port input wire, capacitance of resistor first port input wire, charge of resistor first port input wire) if the strength parameter of the resistor first port input wire is 2. If it is not 2, the resistor second port output wire is characterized by the same four-tuple as for the resistor first port input wire. This is expressed in the following pseudolanguage:

```
out2(s) =
if strength(in1(s)) = 2
then wire(1,value(in1(s)),capacit(in1(s)),charge(in1(s)))
else in1(s)
```

The primitive element "ground" has one port with an output line characterized by the four-tuple (2, false, 0, 0). The primitive element "power source" has one port with an output line characterized by the four-tuple (2, true, 0, 0).

The primitive element "capacitor" has only one port. The capacitor is the memory element and is important in circuit nets that are not connected to sources with a strength greater than 0. The model of the capacitor remembers the previous value stored until the input strength becomes greater than 0, at which time the new value is stored. The output line of the capacitor port has 0 strength and its value parameter depends on the stored charge. Since the charge that gets stored at any particular moment depends on the strength of the input and the charge that was previously stored, it is modeled using a state variable. This is preferably implemented using the state transition approach. In the following definition, s is the state variable and the function p(s) is the transition function. Intuitively, p(s) stands for the state after a "pulse" is received. Q(s) stands for the stored charge in state s. Q(p(s)) is the stored charge after the pulse is received. This is represented in the pseudolanguage below in which input and output wires of the capacitor port are respectively denoted in(s) and out(s) and c(s) is the capacitance of the capacitor:

```
Q(p(s)) == if strength(in(s)) > 0
then if value (in(s)) = true then c(s) else 0
else if (2 * Q(s) + 2 * charge(in(s)) >
c(s) + capacitance(in(s)) )
then c(s)
else 0;
out(s) == if (Q(s)>0) then wire (0,true,c(s),c(s))
else wire (0,false,c(s),0);
```

As seen in the above pseudolanguage, if the strength of the input wire of the capacitor port is not open circuit, then the capacitor is charged according to the input value. If the input strength is open circuit, charge sharing may take place. In accordance with a preferred practice of the present invention, a threshold of one half full voltage is arbitrarily assigned to determine whether the capacitor is charged (which would be interpreted as true) or not charged (which would be interpreted as false). If the net charge divided by the net capacitance is greater than the arbitrary threshold, then the capacitor is treated as charged. The last line which defines "out(s)" in the above pseudolanguage serves to interpret the value represented by the charge. One skilled in the circuit verification art could exercise a choice of a different threshold value than that preferred herein.

Where it is necessary to model charge sharing between capacitors in a digital circuit, such charge sharing is modelled by combining the charge on the capacitor with the total charge attached to the total input capacitance.

The primitive element "transistor" is modeled here as an MOS device though other transistor types would be modeled in analogous fashion. The MOS transistor is either a wire or an open circuit depending on the logic value of the signal applied to its gate input. The transistor element has three ports: gate, source and drain. For an "n" type transistor, the source and the drain ports are connected when the value of the gate input is high (i.e. true) and disconnected when the value is low (i.e. false). The model of the "p" type is similar, except that the sense of the control due to the gate is inverted. Gate capacitance is not modeled in the transistor model itself, but can be addressed by including a capacitor in the circuit. Similarly, a resistor can be included to model pull up resistance associated with an NMOS transistor. In the pseudolanguage representation, below, of the transistor, the source and the drain ports are composed of wires in1, out1, in2 and out2. The gate port is composed of the wires incnt1 and outcnt1. The state variable is "s".

```
out2(s) = =
if value(incntl(s)) = true then in1(s) else wire(O,unc,O,O);
out1(s) = =
if value(incntl(s)) = true then in2(s) else wire(O,unc,O,O);
outcntl(s) = = wire (O,unc,O,O);
```
where unc ≡ uncertain The three-port join element enables modeling of circuits where three or more lines from other circuit elements meet. The join element thus allows complicated circuit nets to be broken down into simpler nets. The four-tuple descriptive of the output wire of each port of the join depends on the input wires of the other two ports. For first, second and third join ports, if the strength and value parameters of the second join port input wire dominate over the strength and parameter values of the third join port input wire or vice versa, then the first join port output wire strength and value parameters are set equal to that of the dominating input wire. If the respective strength parameters of the second and third join port input wires are equal and non-zero and their respective values are different from one another, then the first join port output wire value is uncertain. If the strength of each second and third join port input wire is O and if the combined charge of the second and third join port input wires exceeds half their combined capacitance, then the first join port output wire has the value true. The capacitance and charge of the first join port output wire are respectively the sums of the capacitance and charge of the second and third join port input wires. These relationships are expressed in the following pseudolanguage in which "s" is the state variable and the three ports of the join element are respectively composed of wires in1(s), out1(s); in2(s), out2(s); and in3(s), out3(s). The letters "a" and "b" are used as dummy labels to distinguish between the two ports being considered when evaluating the output wire of the other port. (i.e., in the above description, to distinguish between the second and third join ports when evaluating the output wire of the first port).

```
sumcap(a,b) = = capacitance(a) + capacitance(b);
sumchg(a,b) = = charge(a) + charge(b);
joinout(a,b) = =
if strength(a) > strength(b)
then wire(strength(a),value(a),sumcap(a,b),sumchg(a,b))
else
if strength(a) < strength(b)
then wire(strength(b),value(b),sumcap(a,b),sumchg(a,b))
else
if strength(a) > 0
then
if value(a) = value(b)
then wire(strength(a),value(a),sumcap(a,b),sumchg(a,b))
else wire(strength(a),unc, sumcap(a,b),sumchg(a,b))
else if 2 * sumchg(a,b) > sumcap(a,b)
then wire(strength(a),true,sumcap(a,b),sumchg(a,b))
else wire(strength(a),false,sumcap(a,b),sumchg(a,b));
out1(s) = = joinout(in2(s),in3(s));
out2(s) = = joinout(in3(s),in1(s));
out3(s) = = joinout(in1(s),in2(s)).
```

An example is now provided of the modeling of an inverter circuit 150, illustrated in FIG. 2, using the primitive circuit elements described hereinabove. Modeling comprises specifying an implementation of the inverter in terms of the primitive circuit elements (i.e., a structural specification). The inverter circuit may be specified structurally by a power source PS, a resistor R, a join J, a transistor T and a ground G, those primitive elements being labeled connected as shown in FIG. 2. The inverter circuit has an input port #1 and an output port #2. As stated above, in order to verify a circuit by formal proof, it is necessary to prepare a behavioral specification of how the circuit is supposed to perform. Then, the circuit model is subjected to verification by proof to determine whether it satisfies the specified behavioral requirements. The behavior of the inverter circuit 150 may nbe specified as follows. If the value of the input wire of port #1 input is true, then the output wire of port #2 has strength 2 and the value false. If the value of the port #1 wire is false, then the output wire of port #2 has strength 1 and value true. The charge and capacitance value to the output wires of both ports are O. This behavioral specification is expressed in the following pseudolanguage in which the wires composing port #1 are designated in1(s) and out1(s), the wires composing port #2 being in2(s) and out2(s).

```
out2(s) = = if value(in1(s)) = false then
wire(1,true,O,O) else wire(2,false,O,O);
out1(s) = = wire(O,unc,O,O);
```

The modeling of the inverter circuit, using primitive elements, as illustrated in FIG. 2, is expressed in the following pseudolanguage:

```
in1(transistor(s)) = = out(ground(s));
in(ground(s)) = out1(transistor(s));
in2(transistor(s)) = = out1(join(s));
in1(join(s)) = = out2(transistor(s));
incntl(transistor(s)) = = in1(s);
out1(s) = outcntl(transistor(s));
in2(join(s)) = = in2(s);
out2(s) = = out2(join(s));
in3(join(s) = = out2(resistor(s));
```

-continued

```
in2(resistor(s)) = out3(join(s));
in1(resistor(s)) = out(power(s));
in(power(s)) = out1(resistor(s));
```

As previously described, the ports of primitive elements are connected together by equating their respective in and out wires, this being seen in the pseudolanguage. For example, the first pseudolanguage line effects the connection between the input wire of the transistor's first port to the output wire of the ground's port.

Given a circuit model, such as for the inverter, the verification would then proceed, using the previously described model for each primitive element, through use of an automated theorem proving system. Such a system generates the theorems that must be proved in order to verify the circuit design. The modeling system of the present invention was successfully practiced using an automated theorem proving system called Affirm-85. Aspects of this successful practice with Affirm-85 are described in the paper entitled "BIDS: A Method for Specifying and Verifying Bidirectional Hardware Devices" by Musser et al., presented at a hardware workshop held Jan. 12-16, 1987 in Calgary, Alberta, Canada and published in *VLSI Specification, Verification and Synthesis*, Birtwistle and Subrahmanyam, eds., Kluwer Academic Publishers, Boston, 1988. The Affirm-85 system is a modified form of a program called Affirm which was developed at the University of Southern California Information Sciences Institute. The development of abstract data types in the Affirm system is described in the paper entitled "Abstract Data Type Specification in the Affirm System", by Musser, IEEE Transactions on Software Engineering, Vol. SE-6, No. 1, January 1980. It is believed that the Affirm-85 system plus documentation thereof should be available through the U.S. Air Force Systems Command, Rome Air Development Center, Griffiss Air Force Base, N.Y. 13441.

After the design of a device such as the inverter in the above example has been verified, that particular design need not be reverified for every occurrence of an inverter having that design in the overall circuit being verified. In verifying the design of subsequent circuit portions including an inverter of identical design, the inverter would be modeled as a two-port device usings its behavioral specifications. In general, it is a matter of the circuit verifier's choice as to how portions of a circuit design are isolated for verification in order to enable the overall verification process to proceed most efficiently.

While, as indicated above, the preferred practice of the present invention is with the Affirm-85 system, the invention may be successfully practiced with other theorem proving system computer programs or proof checker programs. Such successful practice requires a computer program that aids a user in finding detailed mathematical proofs and checking their soundness. This requirement stems from the nature of the modeling technique of the present invention in that each verification, i.e. the determination that the structural description of a circuit satisfies the behavioral requirement specified for it, involves so many steps that the hand proofs would likely contain omissions or errors. A theorem proving program that satisfies the three requirements listed below will most likely be suitable for the successful practice of the present invention. These requirements are:

(1) The program works with a well-defined, formal logic in which the user expresses formulas to be proved or the program construct such formulas from other forms of input.

(2) The program's manipulations of formulas in the logic have the property of soundness, i.e. the program never transforms an invalid formula into a valid formula.

(3) For most, if not all, formulas that occur in practice (i.e. that arise from inputs connected with the intended application domain), either the program can find the proof, either automatically or with some direction from the user, or from its failed attempts it can report sufficient information indicating that the formula is invalid and thus that some aspect of the problem must be reformulated.

Other computer programs, aside from Affirm-85, which meet the above-listed requirements include the Boyer-Moore Prover ("A Computational Logic", by Boyer and Moore, Academic Press, New York, 1980) and the Higher Order Logic Theorem ("Why Higher Order Logic is a Good Formalism for Specifying and Verifying Hardware", by Gordon, Cambridge University Report, 1985 and "HOL: A Proof Generating System for Higher-Order Logic" by Gordon, published by *VLSI Specification, Verification and Synthesis*, Birtwistle and Subrahmanyam, eds., Kluwer Academic Publishers, Boston, 1988). Although both of these computer programs were originally develoed as general purpose theorem proving programs, both have in fact been applied to the problem of formally verifying circuit designs.

While a preferred embodiment has been illustrated and described herein, it will be obvious that numerous modifications, changes, variations, substitutions and equivalents, in whole or in part, will now occur to those skilled in the art without departing from the spirit and scope contemplated by the invention. Accordingly, it is intended that the invention here be limited only by the scope of the appended claims.

What is claimed is:

1. A method of verifying the circuit design of an electronic circuit using a computer and a theorem proving system, the method comprising the steps of:

forming a behavior specification for each preselected circuit portion of an electronic circuit which characteristizes that circuit portion in terms of operations which apply to the circuit portion;

defining a plurality of primitive circuit elements, each corresponding to a different type of physical circuit element and each having at least one port which includes an input wire and an output wire, each wire being characterized by a strength parameter, a value parameter, a capacitance parameter, and a charge parameter;

said strength parameter being related to resistance and being capable of assuming integer values of 0, 1 or 2 representing, respectively, an open circuit, a moderate resistance, and a low resistance, and being capable of assuming values corresponding to don't care and immaterial;

the value parameter being related to voltage and being capable of assuming boolean values of true, false, and uncertain;

the capacitance parameter being capable of assuming an integer value that ranks a total capacitance availble for delivering charge on the wire;

the charge parameter being capable of assuming integer values that represent a sum of charges of capacitors connected to the wire;

the input wire parameters describing conditions which said electronic circuit would impose on the port of the circuit portion if a connection between the port and the electronic circuit were broken, and the output wire parameters describing another condition which the port would impose upon the electronic circuit if another connection between the port and the circuit were broken;

modeling selected ones of the circuit portions by defining sets of the primitive circuit elements interconnected to implement such selected circuit portions, a first and second primitive circuit element being interconnected at associated ports thereof by equating the parameters of the input and output wires of a port of the first primitive circuit element with the parameters of the output and input wires, respectively, of the associated port of the second primitive circuit element, each such set of primitive circuit elements representing a structural specification of a corresponding one of the selected circuit portions;

verifying the circuit design of each selected circuit portion by using the computer and theorem proving system to determine whether the set of interconnected primitive circuit elements which implement the selected circuit portion satisfies the behavior specification for such portion; and modeling non-selected circuit portions which are identical to selected portions which have been verified using the behavior specification for such non-selected portions, so that circuit portions which are identical need only be verified once.

2. The method of claim 1, wherein each said input and output wire is characterized by a four-tuple of parameters of the form (strength, value, capacitance, charge), and said primitive circuit elements include a resistor having a first and a second resistor port, each port having an input wire and an output wire, and wherein said method further comprises characterizing the first resistor port output wire by the four-tuple (1, value of the second resistor port input wire, capacitance of the second resistor port input wire, charge of second resistor port input wire) if the strength parameters of the second resistor port input wire has a value of 2, otherwise characterizing the first resistor port output wire by the same four-tuple as the second resistor port input wire; and characterizing the second resistor port output wire by the four-tuple (1, value of the first resistor port input wire, capacitance of the first resistor port input wire, charge of the first resistor port input wire) if the strength parameter of the first resistor port input wire is 2, otherwise characterizing the second resistor port output wire by the same four-tuple as the first resistor port input wire.

3. The method of claim 1, wherein the primitive circuit elements comprise a ground, a power source, and a capacitor, and said method comprises defining said ground to have one port with an output wire which is characterized by a four-tuple of (2, false, 0, 0); defining said power source to have one port with an output wire which is characterized by a four-tuple of (2, true, 0, 0); and defining said capacitor to have one port with an output wire which is characterized by a strength of 0 and a value that depends on the charge stored by the capacitor.

4. The method of claim 3, wherein the primitive elements further comprise a transistor having a first transistor port, a second transistor port, and a controlled transistor port, and said method comprises characterizing the first transistor port to have an input wire that is connected to an output wire of the second transistor port and an input wire of the second transistor port that is connected to an output wire of the first transistor port upon the value parameter of the transistor control port being true.

5. The method of claim 4, wherein said primitive elements further include a join element having a first join port, a second join port, and a third join port for connection to three associated ports of other primitive elements, each of said join elements having an input wire and an output wire, said method further comprising characterizing the output wire of the first join port such that if the strength and value parameters of the input wire of the second join port dominate over the strength and value parameters of the input wire of the third join port, then the first join port output wire strength and value parameters are set equal to that of the dominating input wire; if the respective strength parameters of the second and third join port input wires are equal and non-zero and their respective values are different, then the first join port output wire value is uncertain; and if the strength of the second and third join port input wires is zero and if the combined charge of the second and third join port input wires exceed half of a combined capacitance, then the first join port output wire has a value true; and characterizing the capacitance and charge of the first join port output wire as being, respectively, sums of the capacitance and charge of the second and third join port input wires.

6. The method of claim 1, wherein said modeling non-selected circuit portions comprises modeling such portions as a two-port circuit element using the behavior specification for such non-selected circuit portion.

7. The method of claim 1, wherein said verifying comprises calculating the behavior of the interconnected primitive circuit elements corresponding to each selected circuit portion; comparing the calculated behavior with the specified behavior for such circuit portion; and verifying the design of such portion in response to said comparing.

8. A method of verifying the circuit design of an electronic circuit using a computer and a theorem proving system, the method comprising the steps of:

specifying the behavior of each of a plurality of circuit portions of the electronic circuit;

modeling selected ones of the circuit portions by specifying an implementation of each selected portion as an interconnection of a plurality of predefined primitive circuit elements, each primitive circuit element corresponding to a physical circuit element and having at least one port comprising an input wire and an output wire, each wire being characterized by a tuple of parameters of the form (strength, value, capacitance, charge), where the strength parameter is related to circuit resistance and is capable of assuming values representing an open circuit, a moderate resistance, an a low resistance, and capable of assuming a value which does not indicate any particular resistance, the value parameter being related to voltage and being capable of assuming values of true or false to indicate, respectively, the presence or absence of voltage and to assume a value which indicates neither the presence nor absence of voltage, the capacitance parameter ranking a total capacitance available for delivering charge on the wire, the charge parameter representing a sum of charges of capacitors connected to the wire;

said primitive circuit elements being connected together at associated ports by equating parameters which characterize the input and output wires of a port of one primitive circuit element to the same parameters that characterize the output and input wires, respectively, of the associated port of another primitive circuit element which is connected to the first primitive circuit element;

verifying using the computer and theorem proving system that the implementation of each selected circuit portion as modeled by the interconnected primitive circuit elements satisfies the specified behavior for such circuit portion; and modeling non-selected circuit portions which are identical to selected portions which have been verified by using the behavior specified for such non-selected portions, so that identical circuit portions need only be verified once.

9. The method of claim 8, wherein said primitive circuit elements comprise a power source, a ground, a capacitor, a resistor, a transistor, and a three-port join, said power source, said ground and said capacitor each being defined to have one port, said resistor being defined to have two ports, and said transistor and three-port join being defined to have three ports, each of said ports comprising an input wire and an output wire characterized by a tuple of said parameters.

10. The method of claim 8, wherein said step of specifying the behavior comprises preparing for each circuit portion a behavior specification which indicates how such portion is supposed to perform, and wherein said verifying step comprises determining the behavior of the interconnected primitive circuit elements which model such selected circuit portion, and comparing such determined behavior with the specified behavior of the circuit portion to show that the specified behavior is satisfied.

11. The method of claim 8, wherein said modeling of non-selected circuit portions comprises modeling such portions as a two-port hardware element having properties defined by the specified behavior for such circuit portion.

12. The method of claim 8, wherein said equating of parameters to connect primitive circuit elements comprises equating the strength and value parameters.

* * * * *